United States Patent
Zhao

(10) Patent No.: US 11,335,636 B2
(45) Date of Patent: May 17, 2022

(54) GRADUAL BREAKDOWN MEMORY CELL HAVING MULTIPLE DIFFERENT DIELECTRICS

(71) Applicant: HEFEI RELIANCE MEMORY LIMITED, Hefei (CN)

(72) Inventor: Liang Zhao, Sunnyvale, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

(21) Appl. No.: 17/079,363

(22) Filed: Oct. 23, 2020

(65) Prior Publication Data
US 2021/0125924 A1    Apr. 29, 2021

Related U.S. Application Data

(60) Provisional application No. 62/927,359, filed on Oct. 29, 2019.

(51) Int. Cl.
| | |
|---|---|
| G11C 17/18 | (2006.01) |
| H01L 23/525 | (2006.01) |
| H01L 27/112 | (2006.01) |
| G11C 17/16 | (2006.01) |
| G11C 11/56 | (2006.01) |

(52) U.S. Cl.
CPC ...... *H01L 23/5252* (2013.01); *G11C 11/5692* (2013.01); *G11C 17/16* (2013.01); *G11C 17/18* (2013.01); *H01L 27/11206* (2013.01)

(58) Field of Classification Search
CPC ........... H01L 23/5252; H01L 27/11206; H01L 45/04; H01L 45/12; H01L 27/2418; G11C 17/18; G11C 17/16; G11C 11/5692

USPC ................................................ 365/96, 225.7
See application file for complete search history.

(56) References Cited

U.S. PATENT DOCUMENTS

| | | | | |
|---|---|---|---|---|
| 2014/0241031 | A1* | 8/2014 | Bandyopadhyay | H01L 27/11206 365/96 |
| 2016/0171686 | A1* | 6/2016 | Du | G01N 15/1463 382/130 |
| 2017/0276679 | A1* | 9/2017 | Chapman | B01L 3/502761 |
| 2017/0354969 | A1* | 12/2017 | Lionberger | B01L 3/502715 |
| 2019/0305078 | A1* | 10/2019 | Wu | H01L 21/76805 |
| 2020/0176513 | A1* | 6/2020 | Wang | H01L 27/2481 |
| 2020/0185521 | A1* | 6/2020 | Zhang | H01L 29/1095 |
| 2020/0194312 | A1* | 6/2020 | Then | H01L 29/66462 |
| 2020/0227544 | A1* | 7/2020 | Then | H01L 29/2003 |
| 2020/0258918 | A1* | 8/2020 | Rui | H01L 27/1225 |
| 2020/0395386 | A1* | 12/2020 | Lilak | H01L 21/28531 |
| 2020/0411513 | A1* | 12/2020 | Jambunathan | H01L 29/785 |
| 2021/0005251 | A1* | 1/2021 | Wang | G11C 13/003 |
| 2021/0074702 | A1* | 3/2021 | Le | H01L 21/8258 |

(Continued)

*Primary Examiner* — Michael T Tran
(74) *Attorney, Agent, or Firm* — Sheppard Mullin Richter & Hampton LLP

(57) ABSTRACT

The disclosed embodiments provide gradual breakdown memory cell having multiple different dielectrics. In some embodiments, a multi-level one-time-programmable memory cell, comprises: a top electrode; a bottom electrode; and a plurality of dielectric layers disposed between the top and bottom electrodes, wherein at least one of the following is true: at least two of the dielectric layers are of different dielectric materials; and the multi-level one-time-programmable memory cell comprises at least one metal layer, wherein each metal layer is disposed between two of the dielectric layers.

20 Claims, 9 Drawing Sheets

(56) References Cited

U.S. PATENT DOCUMENTS

| | | | |
|---|---|---|---|
| 2021/0112651 A1* | 4/2021 | Lee | A61L 9/22 |
| 2021/0209752 A1* | 7/2021 | Tenney | G06T 7/0012 |
| 2021/0273331 A1* | 9/2021 | Misaki | H01Q 9/0407 |
| 2021/0408373 A1* | 12/2021 | Chen | H01L 45/1266 |

* cited by examiner

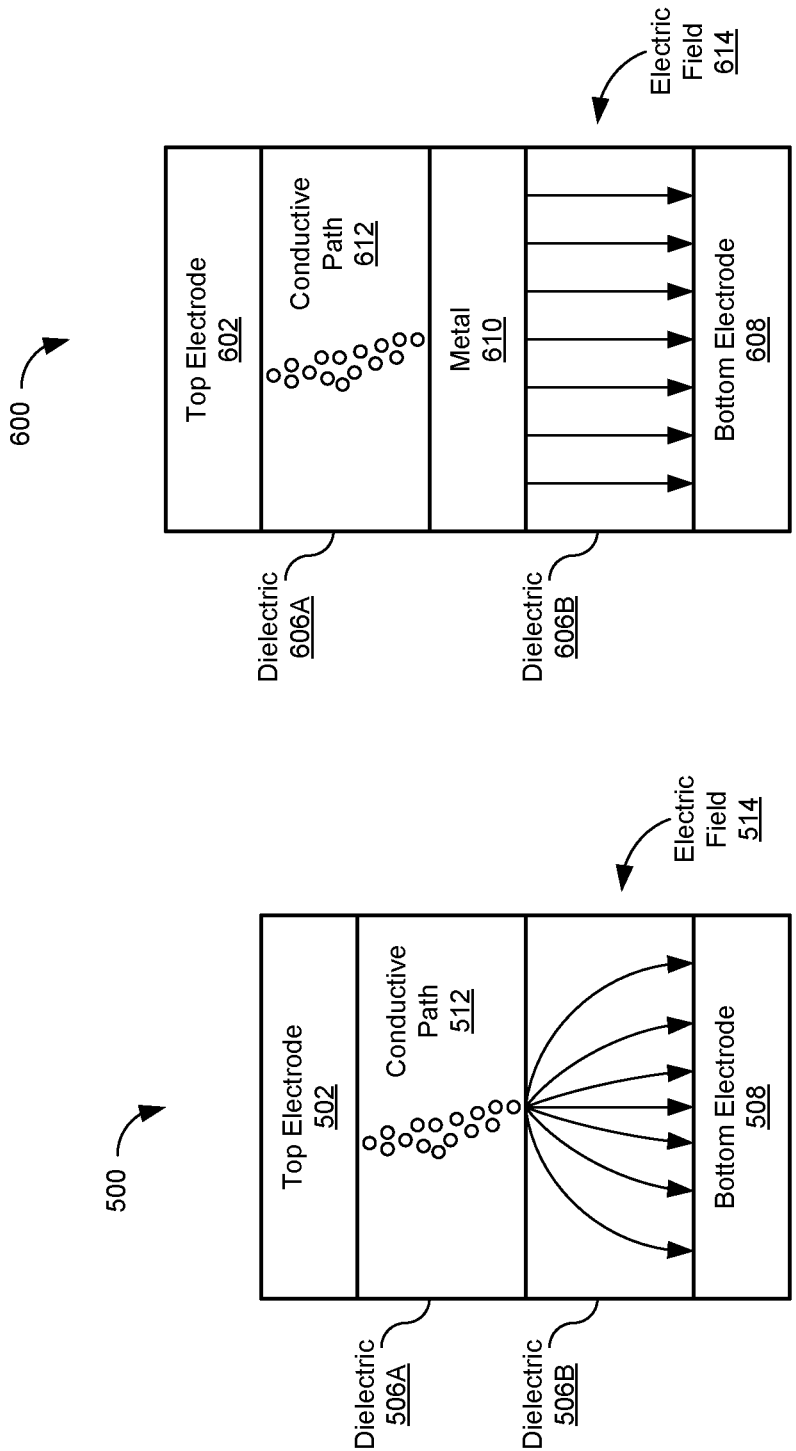

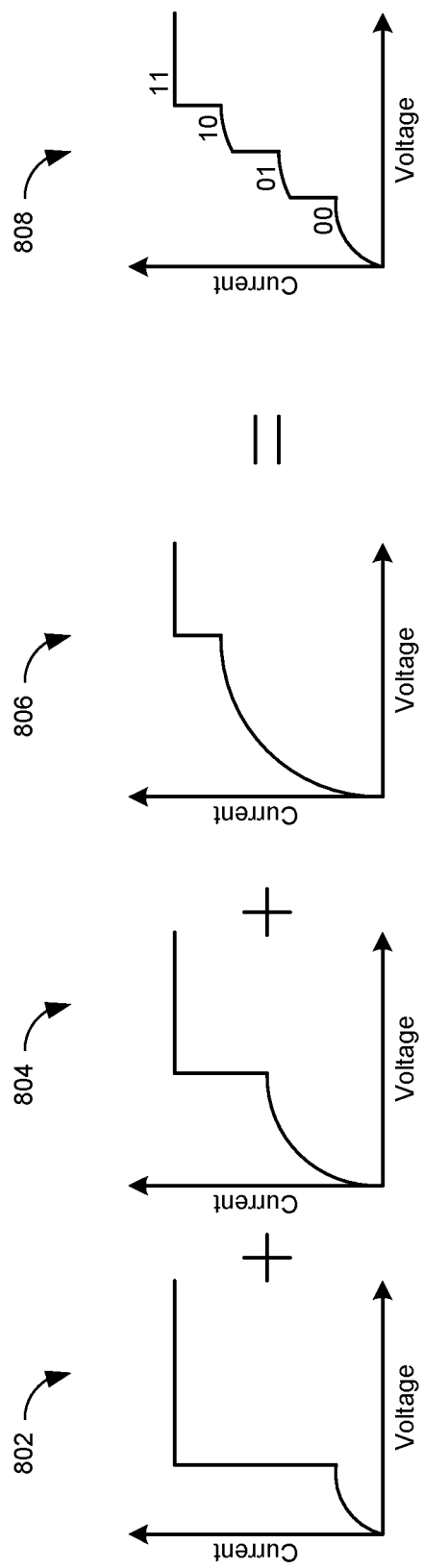

900

Provide a multi-level one-time-programmable memory cell, comprising a top electrode, a bottom electrode, and a plurality of dielectric layers disposed between the top and bottom electrodes, wherein at least two of the dielectric layers comprise different dielectric materials.
902

Apply a voltage between the top and bottom electrodes such that at least one of the dielectric layers experiences a change of resistive state from a first resistive state to a second resistive state through dielectric breakdown.
904

FIG. 9

GRADUAL BREAKDOWN MEMORY CELL HAVING MULTIPLE DIFFERENT DIELECTRICS

CROSS REFERENCE TO RELATED APPLICATIONS

The present application claims priority to U.S. Provisional Patent Application No. 62/927,359, filed Oct. 29, 2019, entitled "Gradual Breakdown Cell For Multi-Level One-Time-Programmable (OTP) Memory," the disclosure thereof incorporated by reference herein in its entirety.

BACKGROUND

The disclosed technology relates generally to memory technology, and more particularly some embodiments relate to memory devices and methods for using them.

BRIEF DRAWINGS DESCRIPTION

The present disclosure, in accordance with one or more various embodiments, is described in detail with reference to the following figures. The figures are provided for purposes of illustration only and merely depict typical or example embodiments.

FIG. 5 illustrates the current-crowding problem.

FIG. 6 illustrates a solution to the current-crowding problem according to some embodiments of the disclosed technologies.

FIG. 8 presents a series of graphs that graphically illustrate the manner in which a gradual breakdown OTP memory cell may be programmed with different values according to some embodiments of the disclosed technologies.

FIG. 9 illustrates a process for programming a multi-level OTP memory cell according to some embodiments of the disclosed technologies.

Figure 10:
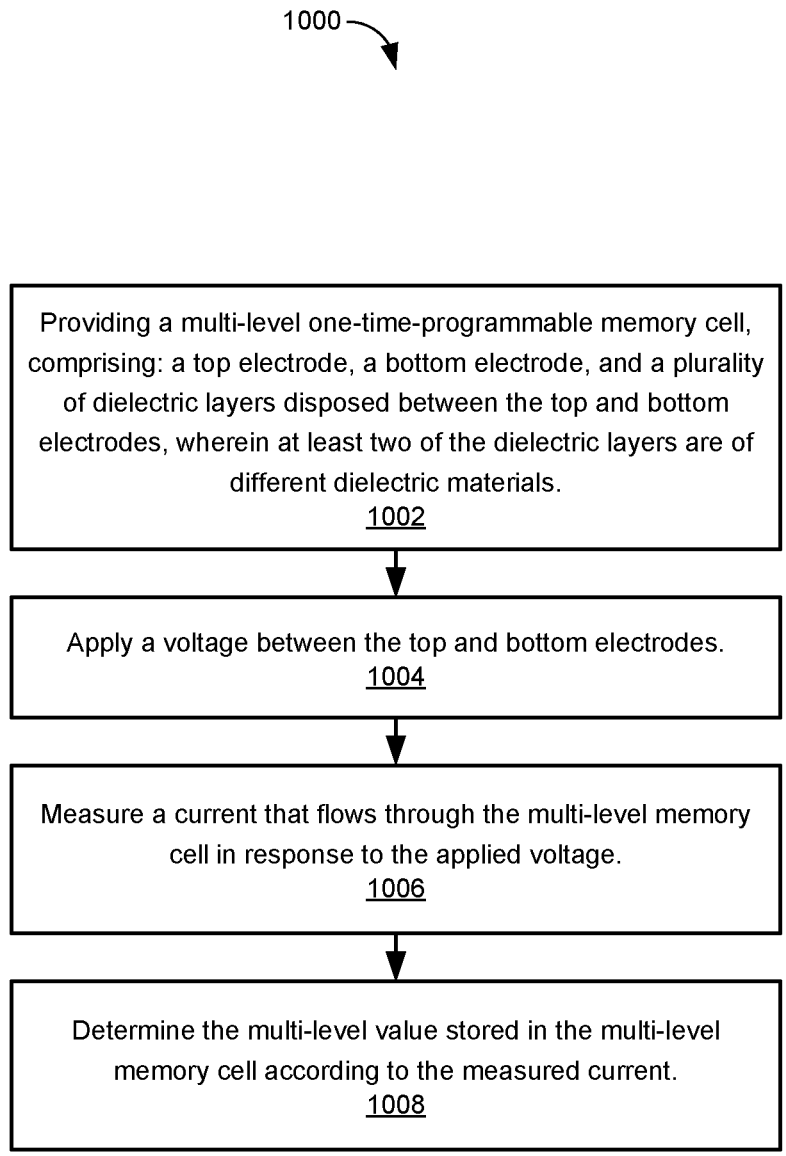

FIG. 10 illustrates a process for reading a multi-level OTP memory cell according to some embodiments of the disclosed technologies.

Figure 11:
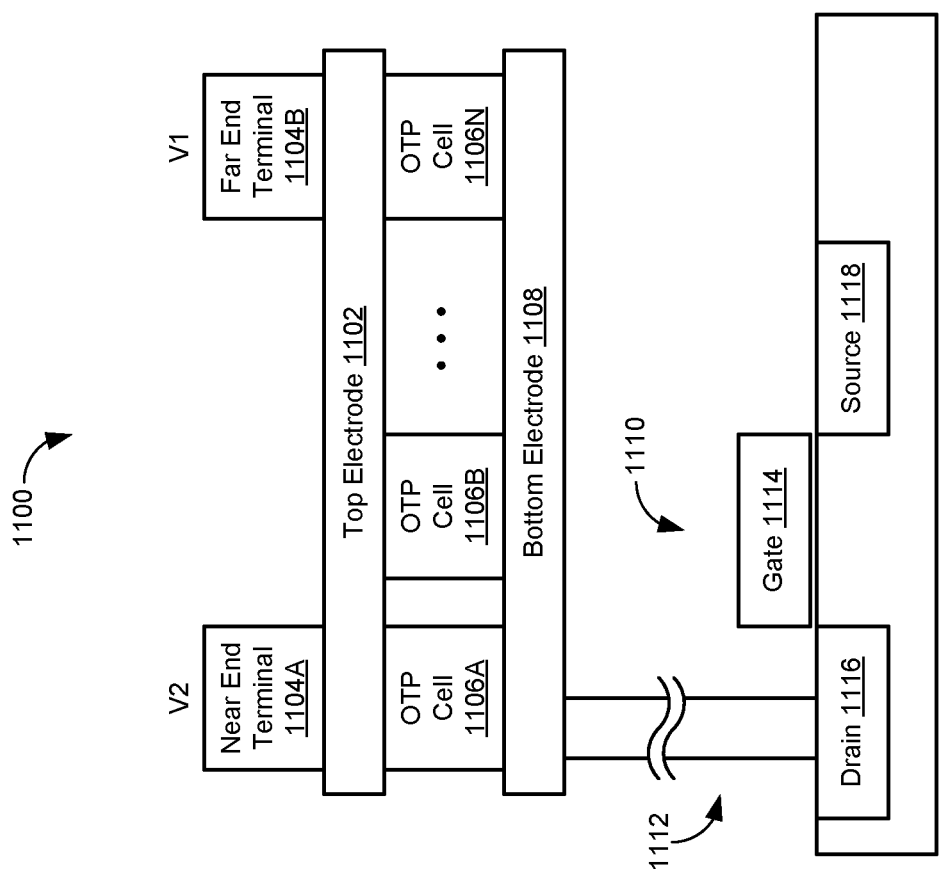

FIG. 11 illustrates a multi-level OTP memory cell be formed by placing multiple OTP piece cells in parallel according to some embodiments of the disclosed technologies.

Figure 12:
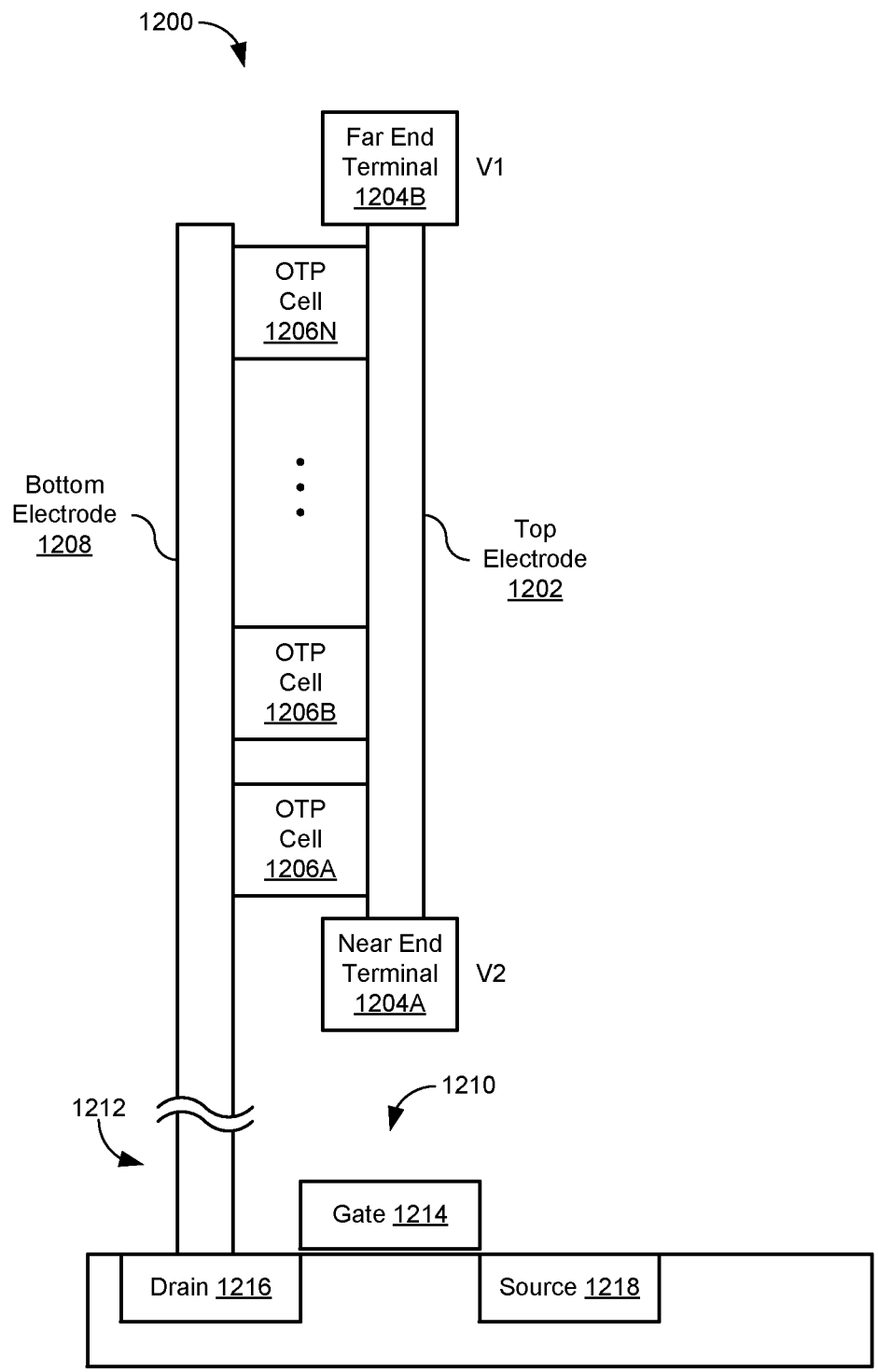

FIG. 12 illustrates multi-level OTP cell implemented as a 3D structure by orienting the top and bottom electrodes vertically according to some embodiments of the disclosed technologies.

The figures are not exhaustive and do not limit the present disclosure to the precise form disclosed.

DETAILED DESCRIPTION

Dielectric breakdown is the formation of conducting pathways through an insulating material in the presence of strong electric field. The dielectric breakdown phenomena are sometimes recoverable, but ultimately destructive. Both recoverable and destructive breakdown have been utilized to implement memory devices. For example, oxide breakdown has been used in the region of the source and drain of a MOSFET to implement a one-time-programmable (OTP) memory cell. However, existing technologies use only one dielectric layer subject to breakdown, enabling the storage of only one bit of information in each OTP memory cell.

Embodiments of the disclosed technologies provide gradual breakdown OTP memory cells where each cell is capable of storing multiple bits of information. Each OTP memory cell may include a plurality of layers of dielectric material, where each layer is subject to dielectric breakdown. When a DC or pulsed voltage is applied, the different dielectric layers may breakdown at different voltages. Controlling the highest applied voltage allows control of which dielectric layers break down, and which dielectric layers do not break down. Accordingly, the disclosed OTP memory cells are capable of storing N+1 bits of information, where N is the number of layers of dielectric material.

In some embodiments, one or more metal layers may be disposed between or adjacent to the dielectric layers. In some embodiments, the metal layers are of different metals. The different metals may be used with dielectric layers that are of the same or different dielectric materials. When dielectric layers of the same dielectric material are used with metal layers of different metals, the metals may cause the breakdown voltages of the dielectric layers to become different.

Figure 1:
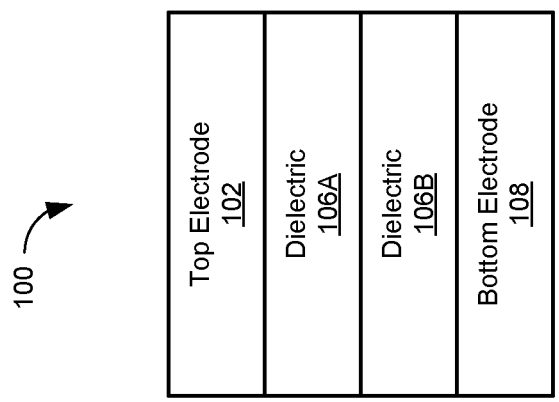
FIG. 1 illustrates a two-dielectric OTP memory cell according to some embodiments of the disclosed technologies.

In some embodiments, a gradual breakdown OTP memory cell is formed by stacking two or more dielectric layers in series between two electrodes. FIG. 1 illustrates a two-dielectric OTP memory cell 100 according to some embodiments of the disclosed technologies. Referring to FIG. 1, the OTP memory cell 100 includes a stack of two dielectric layers 106A,B disposed between a top electrode 102 and a bottom electrode 108. The top electrode 102 contacts only one (106A) of the dielectric layers, while the bottom electrode 108 contacts only another one (106B) of the dielectric layers. In the example of FIG. 1, each of the dielectric layers 106 has a different breakdown voltage. Therefore this OTP memory cell 100 is capable of storing N+1=3 bits of information.

Figure 2:
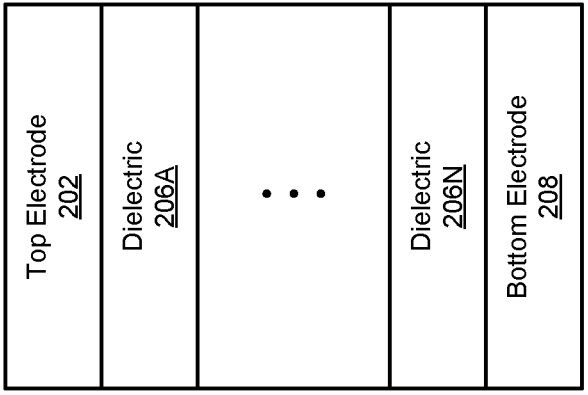
FIG. 2 illustrates an N-dielectric OTP memory cell according to some embodiments of the disclosed technologies.

However, in other embodiments, a stack of more than two dielectric layers may be used. FIG. 2 illustrates an N-dielectric OTP memory cell 200 according to some embodiments of the disclosed technologies. Referring to FIG. 2, the OTP memory cell 200 includes a stack of N dielectric layers 206A-N disposed between a top electrode 202 and a bottom electrode 208. The top electrode 202 contacts only one (206A) of the dielectric layers, while the bottom electrode 208 contacts only another one (206N) of the dielectric layers. In the example of FIG. 2, each of the N dielectric layers 206 has a different breakdown voltage. Therefore this OTP memory cell 200 is capable of storing N+1 bits of information.

Figure 3:
FIG. 3 illustrates a two-dielectric OTP memory cell with two metal layers according to some embodiments of the disclosed technologies.

In some embodiments, a gradual breakdown OTP memory cell is formed by stacking two or more dielectric layers and one or more metal layers between two electrodes. FIG. 3 illustrates a two-dielectric OTP memory cell 300 with two metal layers according to some embodiments of the disclosed technologies. Referring to FIG. 3, the OTP memory cell 300 includes a stack of two dielectric layers 306A,B and two metal layers 310A,B disposed between a top electrode 302 and a bottom electrode 308. Each electrode 302, 308 contacts less than two of the dielectric layers 306. The top electrode 302 contacts none of the dielectric layers, while the bottom electrode 308 contacts only one dielectric layer 306B. In the example of FIG. 3, the OTP memory cell 300 is capable of storing N+1=3 bits of information.

In the example of FIG. 3, a metal layer 310 is disposed on top of a dielectric layer 306. However, other examples may feature other arrangements. For example, a metal layer 310 may be disposed below a dielectric layer 306. As another example, the metal layer 310A may be omitted. Other arrangements are contemplated.

In some embodiments, the dielectric layers 306 may be of the same or different dielectric materials. In some embodiments, the metal layers 310 may be of the same or different metals. For example, in embodiments where the dielectric layers 306A,B are of different dielectric materials having different breakdown voltages, the metal layers 310 may be of the same metal. In some embodiments, the dielectric layers 306 may be of different dielectric materials, and the metal layers 310 may be of different metals.

As another example, in embodiments where the dielectric layers 306 are of the same dielectric material and have the same breakdown voltage, the metal layers 310 may be of different metals. When a DC or pulsed voltage is applied, the different dielectric layers 306 may break down at different voltages due to effects of the metals, for example such as injection, interface reactions, and the like. Controlling the applied voltage allows control of which dielectric layers break down, and which dielectric layers do not break down.

Figure 4:
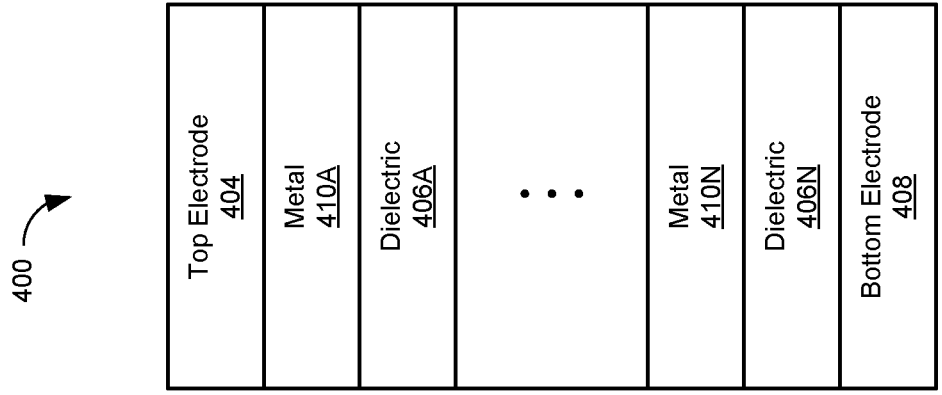
FIG. 4 illustrates an N-dielectric OTP memory cell according to some embodiments of the disclosed technologies.

In other embodiments, a stack of more than two dielectric layers 306 and two metal layers 310 may be used. FIG. 4 illustrates an N-dielectric OTP memory cell 400 according to some embodiments of the disclosed technologies. Referring to FIG. 4, the OTP memory cell 400 includes a stack of N dielectric layers 406A-N disposed between a top electrode 402 and a bottom electrode 408. Each electrode 402, 408 contacts less than two of the dielectric layers 406. The top electrode 402 contacts none of the dielectric layers, while the bottom electrode 408 contacts only one dielectric layer 406B. In the example of FIG. 4, the OTP memory cell 400 is capable of storing N+1 bits of information. In some embodiments, the OTP memory cell may have fewer metal layers than dielectric layers.

The inclusion of metal layers in the disclosed OTP memory cells may provide one or more advantages. A metal layer may modify the dielectric breakdown behavior of the adjacent dielectric layer. When active metal ions such as copper are injected into the dielectric materials, they assist and accelerate the breakdown process, thereby lowering the breakdown voltage. Accordingly, less voltage is needed to program the OTP memory cells. When other types of metal are used, the metal injection phenomenon may not occur, and the breakdown voltage of the adjacent dielectric material may remain the same, or even increase. Therefore, the breakdown voltages for each layer may be accurately controlled.

The use of metal layers may also solve what is known as the current-crowding problem between adjacent dielectrics. FIG. 5 illustrates the current-crowding problem. Referring to FIG. 5, a two-dielectric OTP memory cell 500 without metal layers is shown. The dielectric layer 506A has experienced dielectric breakdown, and a conductive path 512 has been formed through the dielectric layer 506A from the top electrode 502 to the lower dielectric layer 506B. With current crowding, the electric field 514 within the dielectric layer 506B between the upper dielectric layer 506A and the bottom electrode 508 becomes distorted, converging at the conductive path 512. This current crowding may cause undesirable variations in the breakdown behaviors of the dielectric layer 506B.

The addition of a metal layer may solve this current-crowding problem. FIG. 6 illustrates a solution to the current-crowding problem according to some embodiments of the disclosed technologies. FIG. 6 shows a two-dielectric OTP memory cell with a metal layer 610 between two dielectric layers 606A,B. In the example of FIG. 6, the dielectric layer 606A has experienced dielectric breakdown, and a conductive path 612 has formed through the dielectric layer 606A from the top electrode 602 to the metal layer 610. However, thanks to the inclusion of the metal layer 610, the electric field 614 between the metal layer 610 and the bottom electrode 608 is uniform, leading to predictable breakdown behaviors of the dielectric layer 606B.

Figure 7:
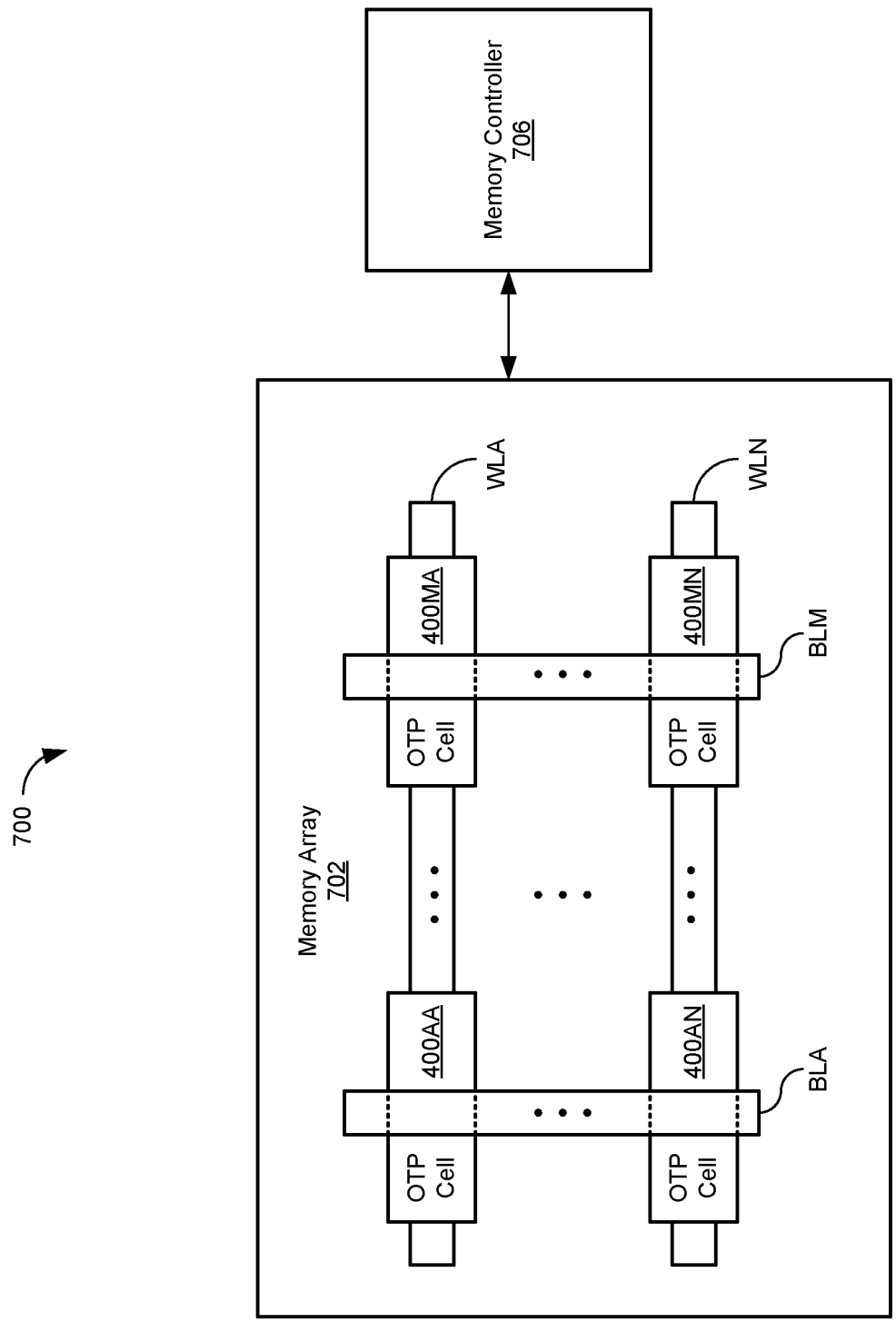
FIG. 7 illustrates a memory system in which the disclosed gradual breakdown OTP memory cells may be implemented.

FIG. 7 illustrates a memory system 700 in which the disclosed gradual breakdown OTP memory cells may be implemented. Referring to FIG. 7, the OTP memory array 700 may be a cross-point array that includes M columns of OTP memory cells 400, with each column including N rows of the memory cells 400. Each of the M columns is driven by one of M bit lines BLA-BLM. Each of the N rows is driven by one of N word lines WLA-WLN. OTP memory cell 400AA is connected to bit line BLA and word line WLA. OTP memory cell 400AN is connected to bit line BLA and word line WLN. OTP memory cell 400MA is connected to bit line BLM and word line WLA. OTP memory cell 400MN is connected to bit line BLM and word line WLN. Other OTP memory cells 400 in the OTP memory array 700 are connected in a similar manner. The memory controller 706 may control the bit lines BL and the word lines WL to access particular memory cells 704. In some embodiments, the memory controller 706 may program the memory cells 704. In some embodiments, the memory controller may read the memory cells 704 to determine their states. In some embodiments, the memory controller 706 may both program and read the memory cells 704.

FIG. 8 presents a series of graphs that graphically illustrate the manner in which a gradual breakdown OTP memory cell may be programmed with different values according to some embodiments of the disclosed technologies. Each of the graphs shows a plot of voltage versus current. In the example of FIG. 8, the OTP memory cell includes three dielectric layers, and is therefore capable of storing four values. Graphs 802, 804, and 806 illustrate the dielectric breakdown characteristics of the three dielectric layers, respectively. As can be seen from these graphs, the first dielectric layer has a low breakdown voltage, as shown at 802; the second dielectric layer has a moderate breakdown voltage, as shown at 804; and the third dielectric layer has a high breakdown voltage, as shown at 806. The three graphs 802, 804, and 806 are combined in graph 808, which shows the I-V characteristics of the OTP memory cell, as well as the different binary values that may be assigned to the different breakdown voltages and currents. The illustrated voltages may be used to program the memory cell with these values, while the illustrated currents may be used to read the values from the memory cell.

FIG. 9 illustrates a process 900 for programming a multi-level OTP memory cell according to some embodiments of the disclosed technologies. While elements of the disclosed processes are presented in a particular order, it should be understood that in various embodiments the elements may be performed in other orders, in parallel, omitted, or any combination thereof. The process 900 may be performed, for example, by the memory controller 706 of FIG. 7.

Referring to FIG. 9, the process 900 may include at 902 providing a multi-level one-time-programmable memory cell. The multi-level one-time-programmable memory cell includes: a top electrode, a bottom electrode, and a plurality of dielectric layers disposed between the top and bottom electrodes. At least one of the following is true for the multi-level one-time-programmable memory cell: at least two of the dielectric layers are of different dielectric materials, and the multi-level one-time-programmable memory cell comprises one metal layer, wherein the metal layer is disposed between two of the dielectric layers. For example, any of the disclosed OTP memory cells may be provided.

The process 900 may include applying a voltage between the top and bottom electrodes such that at least one of the dielectric layers experiences a change of resistive state from a first resistive state to a second resistive state through dielectric breakdown, at 904. For example, the voltage may be applied between the top and bottom electrodes in any of the disclosed OTP memory cells. By selecting particular voltages according to the dielectric breakdown voltages of the dielectric layers in the memory cells, particular values may be programmed into the memory cells, for example as illustrated in FIG. 8.

FIG. 10 illustrates a process 1000 for reading a multi-level OTP memory cell according to some embodiments of the disclosed technologies. The process 1000 may be performed, for example, by the memory controller 706 of FIG. 7.

Referring to FIG. 10, the process 1000 may include at 1002 providing a multi-level one-time-programmable memory cell. The multi-level one-time-programmable memory cell includes: a top electrode, a bottom electrode, and a plurality of dielectric layers disposed between the top and bottom electrodes. At least one of the following is true for the multi-level one-time-programmable memory cell: at least two of the dielectric layers are of different dielectric materials, and the multi-level one-time-programmable memory cell comprises one metal layer, wherein the metal layer is disposed between two of the dielectric layers. For example, any of the disclosed OTP memory cells may be provided.

The process 1000 may include applying a voltage between the top and bottom electrodes, at 1004, and measuring a current that flows through the memory cell in response to the applied voltage, at 1006. The process 1000 may include determining a multi-level value stored in the multi-level memory cell according to the measured current, at 1008. The value may be determined, for example, as illustrated in FIG. 8.

In some embodiments, a multi-level OTP memory cell may be formed by placing multiple OTP cells in parallel. FIG. 11 illustrates such an OTP memory cell according to some embodiments of the disclosed technologies. Referring to FIG. 11, the multi-level OTP memory cell 1100 may be formed by placing multiple OTP cells 1106A,B-N in parallel between a shared top electrode 1102 and a shared bottom electrode 1108. In some embodiments, one or more of the OTP cells 1106 may be implemented by stacking dielectric layers in series between the top and bottom electrodes 1102, 1108, for example as described above in connection with FIGS. 1 and 2. In some embodiments, the stack may include one or more metal layers, for example as described above in connection with FIGS. 3 and 4. In some embodiments, none of the OTP cells 1106 may contact another one of the OTP cells 1106. For example, an insulating layer (e.g., silicon oxide or nitride) may be disposed between any two OTP cells 1106.

In some embodiments, each OTP cell 1106 may be implemented as a single dielectric layer. In some of these embodiments, all of the dielectric layers of the OTP cells 1106 may be of the same dielectric material. In some of these embodiments, two or more of the dielectric layers may be of different dielectric materials.

At one end, referred to herein as the "near end", the bottom electrode 1108 is electrically coupled to a selection device 1110 by an electrical coupler 1112. In the example of FIG. 11, the selection device 1110 is a transistor having a gate 1114, a drain 1116, and the source 1118, with the drain 1116 electric coupled to the electrical coupler 1112. The electrical coupler 1112 may be implemented as one or more vias, intermediate metal layers, and the like, and combinations thereof.

A first voltage V2 may be applied to the top electrode 1102 at the near end through a near end terminal 1104A that is electrically coupled to the top electrode 1102. A second voltage V1 may be applied to the other end of the top electrode 1102, referred to herein as the "far end", through a far end terminal 1104B that is electrically coupled to the top electrode 1102. During cell operation, different voltages V1 and V2 can be applied, creating a progressive electric potential drop along the top electrode 1102. In some embodiments, the top electrode 1102, and the bottom electrode 1108, can be made more resistive to reduce the current flowing between the near end environment. These embodiments also help to reduce the cell voltage change after other cells are programmed.

In the example of FIG. 11, let Vth represent the dielectric breakdown voltage of the OTP cells 1106. When V1=V2>Vth, all of the OTP cells 1106 may be programmed from a high-resistance state to a low-resistance state. When V1<Vth and V2<Vth, none of the OTP cells 1106 may change state. When V1<V2, cells near the far end may be much more difficult to program. Accordingly, this voltage condition should be avoided. When V1>V2 and V1>Vth, at least one of the OTP cells 1106 may be programmed. Depending on the value of V2, other OTP cells 1106 may or may not be programmed based on whether the voltage drop at the OTP cell 1106 is greater than the dielectric breakdown voltage Vth. Thus by changing the voltage V2, the number of OTP cells 1106 that can be programmed at one time can be controlled. Therefore, multi-level programming operations may be achieved with one voltage pulse.

In some embodiments, the multi-level OTP cell may be implemented as a 3D structure by orienting the top and bottom electrodes vertically. FIG. 12 illustrates such an OTP memory cell according to some embodiments of the disclosed technologies. Referring to FIG. 12, the multi-level OTP memory cell 1200 may be formed by placing multiple OTP cells 1206A,B-N in parallel between a vertical shared top electrode 1202 and a vertical shared bottom electrode 1208 in a linear arrangement. Each of the OTP cells 1206 may be formed of a dielectric material. Each of the OTP cells 1206 may contact both of the top and bottom electrodes 1202, 1208. None of the OTP cells 1206 may contact another one of the OTP cells 1206. In some embodiments, one or more of the OTP cells 1206 may be implemented by stacking dielectric layers in series between the top and bottom electrodes 1202, 1208, for example as described above in connection with FIGS. 1 and 2. In some embodiments, the stack may include one or more metal layers, for example as described above in connection with FIGS. 3 and 4. In some embodiments, none of the OTP cells 1206 may contact another one of the OTP cells 1206. For example, an insulating layer (e.g., silicon oxide or nitride) may be disposed between any two OTP cells 1206.

In some embodiments, each OTP cell 1206 may be implemented as a single dielectric layer. In some of these embodiments, all of the dielectric layers of the OTP cells 1206 may be of the same dielectric material. In some of these embodiments, two or more of the dielectric layers may be of different dielectric materials.

At one end, referred to herein as the "near end", the bottom electrode 1208 is electrically coupled to a selection device 1210 by an electrical coupler 1212. In the example of FIG. 12, the selection device 1210 is a transistor having a gate 1214, a drain 1216, and the source 1218, with the drain 1216 electrically coupled to the electrical coupler 1212. The electrical coupler 1212 may be implemented as one or more vias, intermediate metal layers, and the like, and combinations thereof. A first voltage V2 may be applied to the top electrode 1202 at the near end through a near end terminal 1204A that is electrically coupled to the top electrode 1202. A second voltage V1 may be applied to the other end of the top electrode 1202, referred to herein as the "far end", through a far end terminal 1204B that is electrically coupled to the top electrode 1202. The operation of the multi-level OTP memory cell 1200 of FIG. 12 may be as described for the multi-level OTP memory cell 1100 of FIG. 11.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

A person of ordinary skill in the art will recognize that they may make many changes to the details of the above-described memory device without departing from the underlying principles. Only the following claims, however, define the scope of the memory device.

What is claimed is:

1. A multi-level one-time-programmable memory cell comprising:
   a top electrode;
   a bottom electrode; and
   dielectric layers disposed between the top and bottom electrodes, wherein each of the dielectric layers experiences a dielectric breakdown when a respective breakdown voltage is applied between the top and bottom electrodes and each of the dielectric layers is associated with a different breakdown voltage, and wherein at least one of the following is true:
   at least two of the dielectric layers are of different dielectric materials; or
   the multi-level one-time-programmable memory cell further comprises a metal layer disposed between two of the dielectric layers.

2. The multi-level one-time-programmable memory cell of claim 1, wherein the dielectric layers are disposed between the top and bottom electrodes such that the top and bottom electrodes each contacts one of the dielectric layers.

3. The multi-level one-time-programmable memory cell of claim 1, further comprising:
   a first metal layer disposed between two of the dielectric layers; and
   each of the top and bottom electrodes contacts less than two of the dielectric layers.

4. The multi-level one-time-programmable memory cell of claim 3, further comprising:
   a second metal layer, wherein the first and second metal layers are of different metals.

5. The multi-level one-time-programmable memory cell of claim 1, wherein at least two of the dielectric layers are of the same dielectric material.

6. The multi-level one-time-programmable memory cell of claim 5, wherein none of the dielectric layers contacts another one of the dielectric layers.

7. The multi-level one-time-programmable memory cell of claim 6, further comprising:
   a first terminal electrically coupled to a first end of the top electrode; and
   a second terminal electrically coupled to a second end of the top electrode wherein the dielectric layers are linearly arranged in a direction from the first end of the top electrode to the second end of the top electrode.

8. The multi-level one-time-programmable memory cell of claim 7, further comprising:
   an access device having a third terminal electrically coupled to a first end of the bottom electrode.

9. The multi-level one-time-programmable memory cell of claim 8, wherein the access device is a transistor and the third terminal is a source or a drain of the transistor.

10. A memory device comprising:
    a top electrode having a first end and a second end;
    a bottom electrode having a first end and a second end, wherein the first end of the bottom electrode is near the first end of the top electrode and the second end of the bottom electrode is near the second end of the top electrode; and
    a plurality of one-time-programmable memory cells arranged in parallel between the top and bottom electrodes, wherein each of the plurality of one-time-programmable memory cells contacts the top and bottom electrodes and each of the plurality of one-time-programmable memory cells comprises a dielectric layer that experiences a dielectric breakdown when a respective breakdown voltage is applied between the top and bottom electrodes.

11. The memory device of claim 10, wherein at least one of the plurality of one-time-programmable memory cells comprises at least two dielectric layers.

12. The memory device of claim 11, wherein the at least two dielectric layers are of the same dielectric material.

13. The memory device of claimer 11, wherein the at least two dielectric layers are of different dielectric materials.

14. The memory device of claim 10, wherein at least one of the plurality of one-time-programmable memory cells comprises:
  at least two dielectric layers; and
  at least one metal layer disposed between the at least two dielectric layers.

15. A method comprising:
  providing a multi-level one-time-programmable memory cell comprising:
    a top electrode,
    a bottom electrode, and
    dielectric layers disposed between the top and bottom electrodes; and
  applying a voltage between the top and bottom electrodes to cause a dielectric breakdown on at least two of the dielectric layers causing the at least two of the dielectric layers to change from a first resistive state to a second resistive state.

16. The method of claim 15, wherein providing the multi-level one-time-programmable memory cell comprises:
  disposing the dielectric layers in series between the top and bottom electrodes, wherein at least two of the dielectric layers are of different dielectric materials.

17. The method of claim 15, wherein providing the multi-level one-time-programmable memory cell comprises:
  disposing the dielectric layers in parallel between the top and bottom electrodes.

18. The method of claim 15, wherein the multi-level one-time-programmable memory cell comprises:
  a metal layer disposed between two of the dielectric layers.

19. The method of claim 15, wherein at least two of the dielectric layers are of different dielectric materials.

20. A memory system comprising:
  an array of multi-level one-time-programmable memory cells comprising the multi-level one-time-programmable memory cell of claim 1; and
  a memory controller configured to perform at least one of:
    programming the multi-level one-time-programmable memory cells, and
    reading the multi-level one-time-programmable memory cells.

* * * * *